US009762890B2

(12) United States Patent
Fossum et al.

(10) Patent No.: US 9,762,890 B2
(45) Date of Patent: Sep. 12, 2017

(54) DISTANCE SENSOR AND IMAGE PROCESSING SYSTEM INCLUDING THE SAME

(71) Applicant: Samsung Electronics Co., Ltd., Suwon-si (KR)

(72) Inventors: Eric Fossum, Wolfeboro, NH (US); Tae Yon Lee, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 755 days.

(21) Appl. No.: 14/075,174

(22) Filed: Nov. 8, 2013

(65) Prior Publication Data

US 2015/0130902 A1 May 14, 2015

(51) Int. Cl.
*H04N 13/02* (2006.01)
*H01L 27/146* (2006.01)
*G01S 7/491* (2006.01)

(52) U.S. Cl.
CPC ....... *H04N 13/0203* (2013.01); *G01S 7/4914* (2013.01); *H01L 27/14603* (2013.01); *H01L 27/14609* (2013.01); *H01L 27/14612* (2013.01)

(58) Field of Classification Search
CPC .............. H01L 27/14812; H04N 13/0203
See application file for complete search history.

(56) References Cited

U.S. PATENT DOCUMENTS

| 6,313,484 | B1 * | 11/2001 | Ohkubo | H01L 27/1443 257/343 |
|---|---|---|---|---|
| 6,750,485 | B2 | 6/2004 | Berezin et al. | |
| 7,671,391 | B2 | 3/2010 | Kawahito | |
| 8,115,158 | B2 | 2/2012 | Buettgen | |
| 8,314,924 | B2 | 11/2012 | Bamji et al. | |
| 8,520,104 | B2 | 8/2013 | Fossum et al. | |
| 2009/0190005 | A1 * | 7/2009 | Mo | H04N 5/3575 348/241 |
| 2010/0032729 | A1 * | 2/2010 | Hao | H01L 27/098 257/272 |
| 2010/0141821 | A1 | 6/2010 | Fossum et al. | |
| 2012/0056080 | A1 * | 3/2012 | Levine | H04N 5/3592 250/214 P |

FOREIGN PATENT DOCUMENTS

| KR | 1020090118795 | 11/2009 |
|---|---|---|
| KR | 1020100065434 | 6/2010 |
| KR | 1020130007121 | 1/2013 |

* cited by examiner

*Primary Examiner* — Nam Pham
(74) *Attorney, Agent, or Firm* — Onello & Mello LLP (57) ABSTRACT

A pixel of a distance sensor includes a photosensor that generates photocharges corresponding to light incident in a first direction. The photosensor includes a plurality of first layers having a cross-sectional area increasing along the first direction after a first depth and at least one transfer gate which receives a transfer control signal for transferring the photocharges to a floating diffusion node. A strong electric field is formed in the direction in which the photocharges move horizontally or vertically in the pixel, thereby accelerating the photocharges, allowing for increased sensitivity and demodulation contrast.

11 Claims, 9 Drawing Sheets

FIG. 9 ns in accordance with principles of inventive concepts relate to a pixel, or pixel sensor, included in a depth sensor (also referred to herein as a distance sensor) and an image processing system including the same, and more particularly, to a pixel included in a distance sensor for providing high sensitivity and demodulation contrast and an image processing system including the same.

Image sensors include a plurality of pixels, also referred to herein as pixel sensors, that convert photons within a spectrum band into electrons. Image sensors are widely employed in portable electronic devices, such as cellular telephones or, or, more particularly, smart phones, and improvements in such sensors would benefit a large number of users.

Information about the distance (also referred to herein as depth) between an object and an image sensor, as well as about the color of an imaged object is necessary to obtain a three-dimensional (3D) image. Methods for obtaining information about the distance between the object and the image sensor may be active or passive.

Time-of-flight (TOF) and a triangulation methods are representative active methods. In the TOF method, modulated light is emitted to the object, light reflected from the object is sensed, and the distance is calculated from a phase change in the reflected light. In the triangulation method, the position of light emitted by a laser or the like a certain distance from the sensor and the position of reflected light are sensed and the distance between the sensor and the object is calculated using triangulation. In passive methods, the distance is calculated using only image information, without emitting light. A stereo camera representatively uses a passive method.

SUMMARY

In exemplary embodiments in accordance with principles of inventive concepts, a pixel of a distance sensor, includes: a photosensor arranged to generate photocharges corresponding to light incident in a first direction and to have a cross-sectional area increasing along the first direction after a first depth; and at least one transfer gate arranged to receive a transfer control signal for transferring the photocharges to a floating diffusion node.

In exemplary embodiments in accordance with principles of inventive concepts, the photosensor comprises a plurality of first layers having a pinning voltage that increases along the first direction.

In exemplary embodiments in accordance with principles of inventive concepts, a doping density is arranged to determine the pinning voltage of the first layers.

In exemplary embodiments in accordance with principles of inventive concepts, the cross-sectional area of the photosensor decreases along the first direction up to the first depth.

In exemplary embodiments in accordance with principles of inventive concepts, the photosensor comprises a plurality of second layers having a cross-sectional area that increases along a second direction and the second direction gets towards the floating diffusion node in perpendicular to the first direction.

In exemplary embodiments in accordance with principles of inventive concepts, the second layers have a pinning voltage that increases along the second direction.

In exemplary embodiments in accordance with principles of inventive concepts, the pinning voltage of the second layers is determined by one of a doping density and a junction depth.

In exemplary embodiments in accordance with principles of inventive concepts, the at least one transfer gate comprises two transfer gates in a 2-tap structure.

In exemplary embodiments in accordance with principles of inventive concepts, a pixel further comprises a pinning layer between the two transfer gates.

In exemplary embodiments in accordance with principles of inventive concepts, two transfer gates respectively receive transfer control signals respectively having opposite phases.

In exemplary embodiments in accordance with principles of inventive concepts, a pixel further comprises at least one select gate arranged to receive a selection control signal for outputting an electrical signal corresponding to photocharges accumulated in the floating diffusion node.

In exemplary embodiments in accordance with principles of inventive concepts, an image processing system includes: a distance sensor comprising a plurality of pixels each generating photocharges corresponding to light incident along a first direction and outputting an electrical signal corresponding to the photocharges; and a processor arranged to calculate a distance to an object by processing electrical signals using time-of-flight (TOF) method, wherein each of the pixels comprises: a photosensor arranged to have a cross-sectional area increasing along the first direction after a first depth; and at least one transfer gate arranged to receive a transfer control signal for transferring the photocharges to a floating diffusion node.

In exemplary embodiments in accordance with principles of inventive concepts a photosensor comprises a plurality of first layers having a pinning voltage that increases along the first direction.

In exemplary embodiments in accordance with principles of inventive concepts, in an image processing system, the cross-sectional area of the photosensor decreases along the first direction up to the first depth.

In exemplary embodiments in accordance with principles of inventive concepts, in an image processing system the photosensor comprises a plurality of second layers having a cross-sectional area that increases along a second direction and the second direction gets towards the floating diffusion node in perpendicular to the first direction.

In exemplary embodiments in accordance with principles of inventive concepts, an electronic device, includes: a pixel of a distance sensor that includes a photosensor that generates photocharges corresponding to the intensity of light impinging on a surface of the photosensor the photosensor including layers of increasing cross sectional area, after a first depth, in a direction parallel to the surface of the photosensor upon which light impinges; a floating diffusion node; and a transfer gate arranged to transfer photocharges from the photosensor to a floating diffusion node.

In exemplary embodiments in accordance with principles of inventive concepts, in an electronic device of the increased cross sectional areas are arranged to accelerate photocharges.

In exemplary embodiments in accordance with principles of inventive concepts, an electronic device further comprises a plurality of the pixels of a distance sensor; a light source; and a processor arranged to calculate a distance to an object by processing electrical signals using time-of-flight (TOF) method and using light from the light source and reflected from the object to the pixels.

In exemplary embodiments in accordance with principles of inventive concepts, an electronic device is a portable electronic device further comprising a processor.

In exemplary embodiments in accordance with principles of inventive concepts, a portable electronic device is a cellular telephone.

BRIEF DESCRIPTION OF THE DRAWINGS

The above and other features and advantages of inventive concepts will become more apparent by describing in detail exemplary embodiments thereof with reference to the attached drawings in which.

DESCRIPTION

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
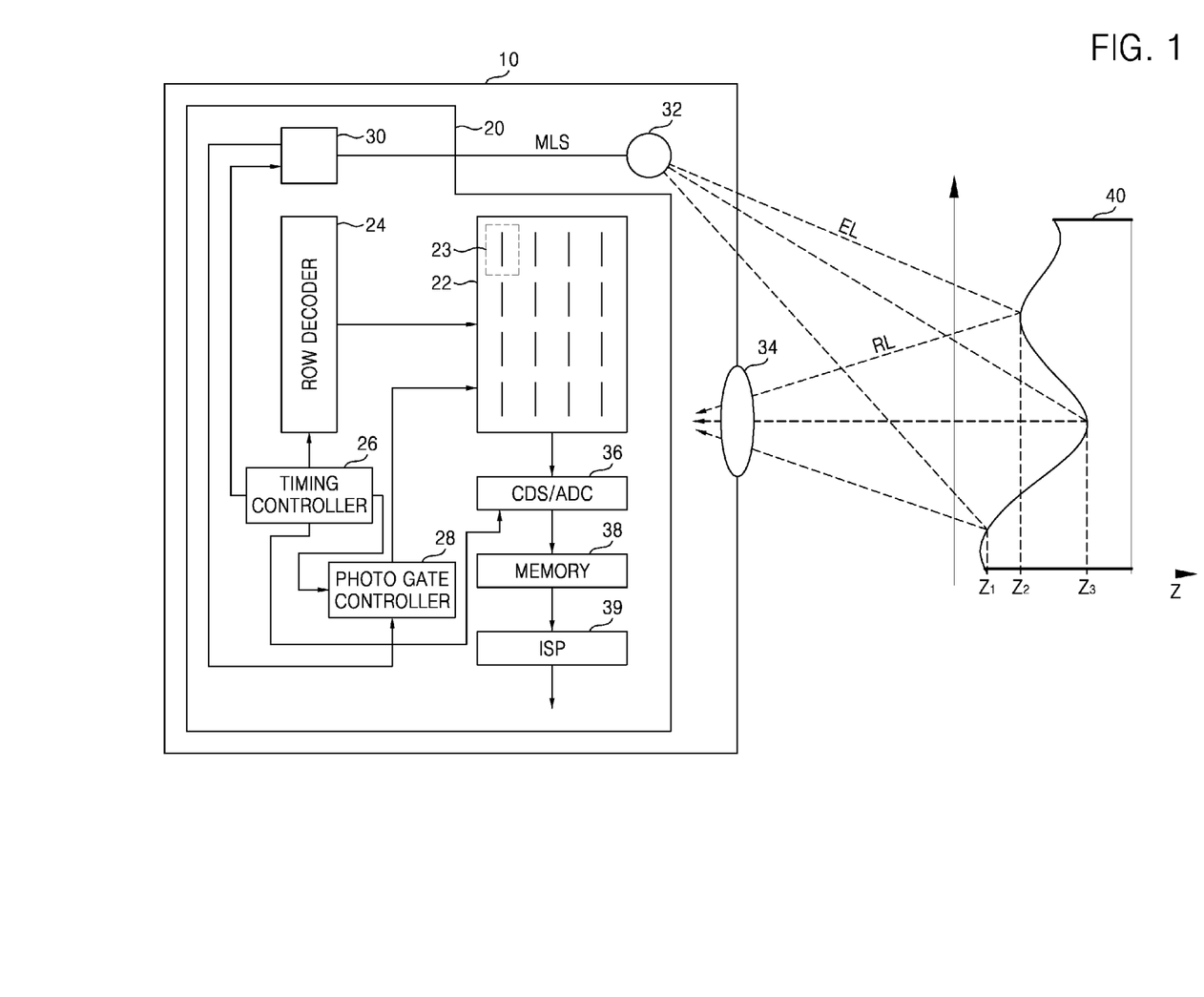
FIG. 1 is a block diagram of a distance sensor according to exemplary embodiments in accordance with principles of inventive concepts.
Figure 2:
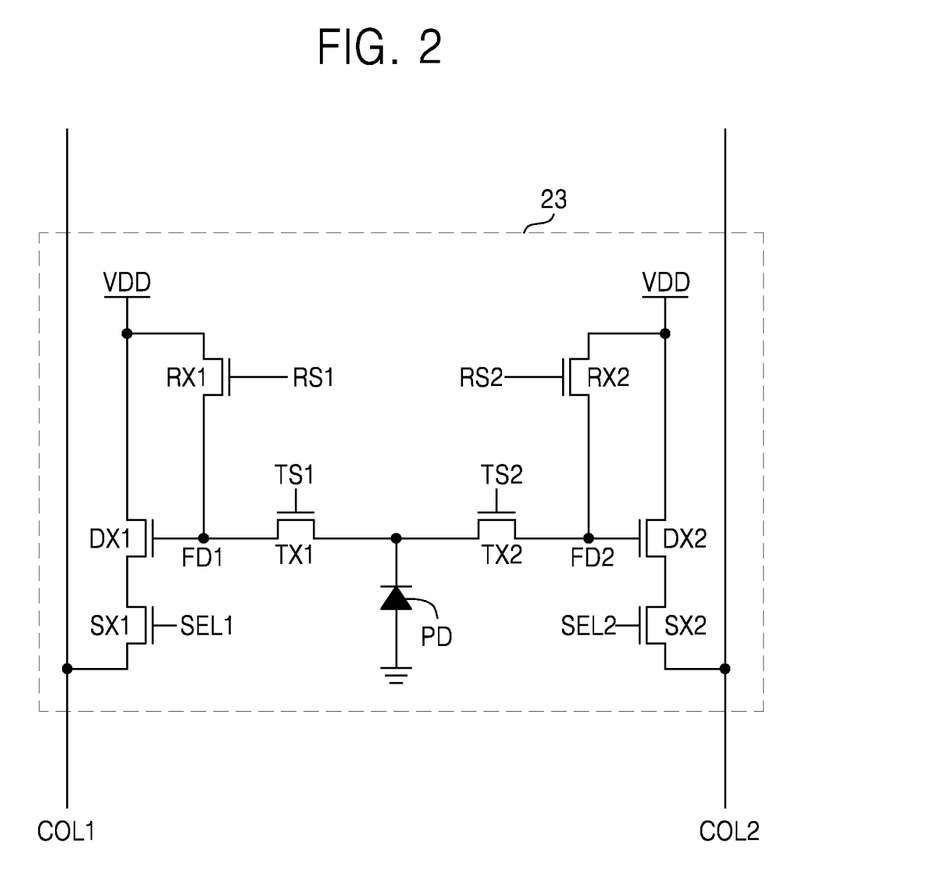
FIG. 2 is a circuit diagram of a 2-tap distance pixel illustrated in FIG. 1.
Figure 3:
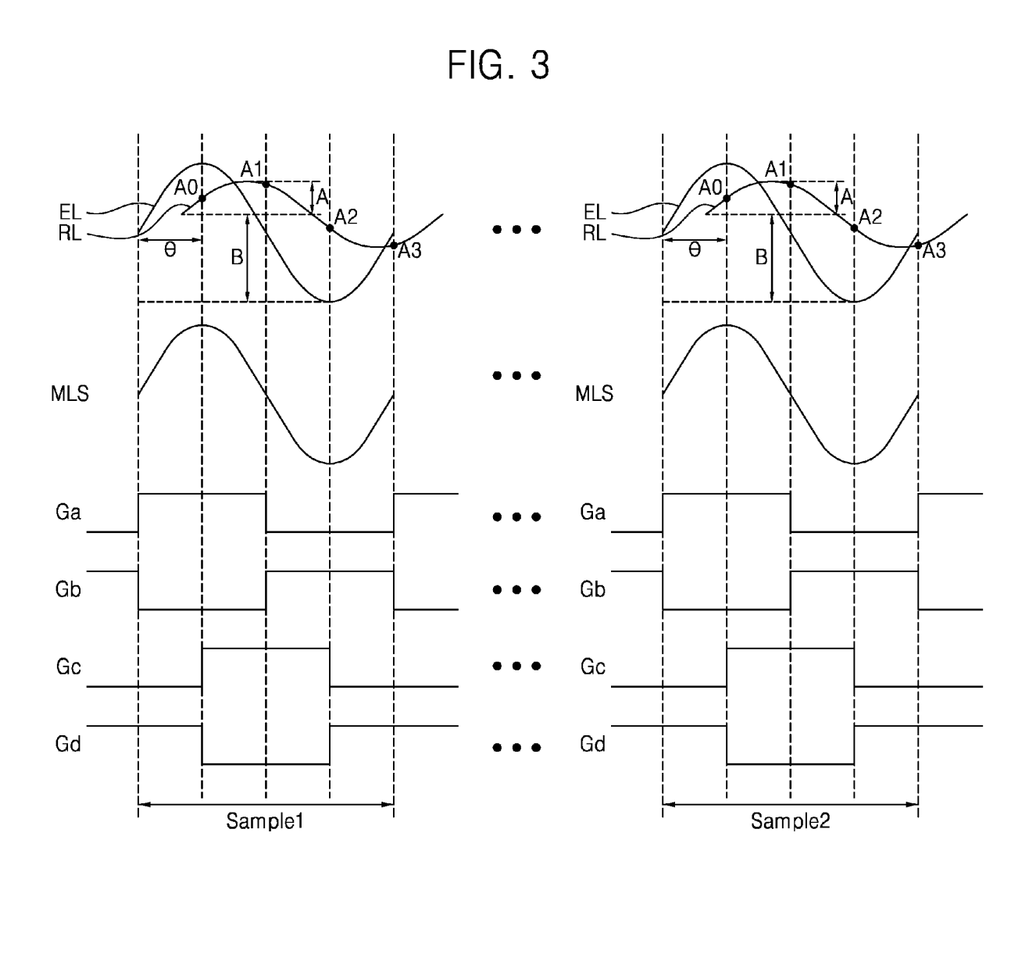
FIG. 3 is a timing chart showing the operation of the 2-tap distance pixel illustrated in FIG. 2.

Hereinafter, exemplary embodiments in accordance with principles of inventive concepts will be explained in detail with reference to the accompanying drawings. FIG. 1 is a block diagram of an exemplary embodiment of a depth, or distance, sensor 10 in accordance with principles of inventive concepts. FIG. 2 is a circuit diagram of a 2-tap distance pixel 23 illustrated in FIG. 1. FIG. 3 is a timing chart showing the operation of the 2-tap distance pixel 23 illustrated in FIG. 2.

Referring to FIGS. 1 through 3, the distance sensor 10, which measures a distance or a depth using a time-of-flight (TOF) principle, includes a semiconductor chip 20 including an array 22 in which a plurality of distance pixels (that is, distance or depth detectors or sensors) 23 are arranged, a light source 32, and a lens module 34. The pixels 23 may be implemented in a 2-tap structure as shown in FIG. 2, or in a 1-tap or 4-tap structure, for example. The distance sensor 10 may be implemented as a part of an image sensor (not shown) that generates a three-dimensional (3D) image using color and distance image information.

Distance pixels 23 implemented in the array 22 in two dimensions, each include at least one transfer gate (for example, TX1 and TX2 in FIG. 2). Each of the distance pixels 23 includes a plurality of transistors for signal processing.

Row decoder 24 selects one row from among a plurality of rows in response to a row address output from a timing controller 26. In this exemplary embodiment in accordance with principles of inventive concepts, a row is a set of distance pixels arranged in a linear direction, a horizontal direction, for example, in the array 22.

In an exemplary embodiment in accordance with principles of inventive concepts, photo gate controller 28 may generate transfer control signals TS1 and TS2 and provide them to the array 22 under the control of the timing controller 26. The transfer control signals TS1 and TS2 may be one of first through fourth photo gate control signals Ga through Gd illustrated in FIG. 3. The photo gate controller 28 may generate a plurality of control signals RS1, RS2, SEL1, and SEL2 applied to the distance pixels 23 under the control of the timing controller 26.

As shown in FIG. 3, in exemplary embodiments in accordance with principles of inventive concepts, the difference between the phase of the first photo gate control signal Ga and the phase of the third photo gate control signal Gc is 90°, the difference between the phase of the first photo gate control signal Ga and the phase of the second photo gate control signal Gb is 180°, and the difference between the phase of the first photo gate control signal Ga and the phase of the fourth photo gate control signal Gd is 270°.

In exemplary embodiments in accordance with principles of inventive concepts, light source driver 30 may generate a clock signal MLS for driving the light source 32 under the control of the timing controller 26. In exemplary embodiments in accordance with principles of inventive concepts, light source 32 emits a modulated optical signal EL to a scene 40 in response to the clock signal MLS. The modulated optical signal EL may have amplitude varying according to the driving of the light source driver 30. In operation, the distance between the scene 40 and the distance sensor 10 may vary. In exemplary embodiments in accordance with principles of inventive concepts, a light emitting diode (LED), an organic LED (OLED), an active-matrix OLED (AMOLED), or a laser diode may be used as the light source 32 and the clock signal MLS or the modulated optical signal EL may be a sine wave or a square wave, for example.

The light source driver 30 applies the clock signal MLS or information about the clock signal MLS to the photo gate controller 28. Photo gate controller 28 generates the first photo gate control signal Ga having the same phase as the clock signal MLS and the second photo gate control signal Gb whose phase is different by 180° from the phase of the clock signal MLS. The photo gate controller 28 also generates the third photo gate control signal Gc whose phase is different by 90° from the phase of the clock signal MLS and the fourth photo gate control signal Gd whose phase is different by 270° from the phase of the clock signal MLS. The photo gate controller 28 and the light source driver 30 may operate in synchronization with each other, for example.

In operation, the modulated optical signal EL output from the light source 32 is reflected from the scene 40. When there are different distances $Z_1$, $Z_2$, and $Z_3$ between the distance sensor 10 and the scene 40, a distance Z is calculated as follows. When, for example, the modulated optical signal EL is represented as a waveform: $A_{in} \cos(\omega t)$, where the waveform period T is given by $T=2\pi/\omega$, $A_{in}$ is the amplitude, and an optical signal RL reflected to a distance pixel is represented as a waveform: $A_{ref} \cos(\omega t+\theta)$, where $A_{ref}$ is the amplitude, a phase shift or phase difference "θ" by TOF is defined as Equation 1:

$$\theta = 2*\omega*Z/C = 2*(2\pi f)*Z/C, \quad (1)$$

where C is the speed of light and f is the frequency of the signal.

Accordingly, the distance Z from the light source 32 or the array 22 to the target scene 40 is calculated using Equation 2:

$$Z = \theta*C/(2*\omega) = \theta*C/(2*(2\pi f)). \quad (2)$$

The reflected optical signal RL is incident on the array 22 through the lens module 34. In this exemplary embodiment in accordance with principles of inventive concepts, the lens module 34 may include a lens and an infrared pass filter and distance sensor 10 includes a plurality of light sources arranged in circle around the lens module 34, but only one light source 32 is illustrated in FIG. 1 for clarity of the description.

The reflected optical signal RL incident on the array 22 through the lens module 34 may be demodulated through N times of sampling, (that is, N samplings. For example, 2 times of sampling for a 2-tap distance pixel). The term sampling indicates that a pixel signal A0, A1, A2, or A3 is generated or detected from the reflected optical signal RL. The pixel signal A0, A1, A2, or A3 will be described in greater detail below. The phase shift A between the modulated optical signal EL and the reflected optical signal RL may be expressed by Equation 3:

$$\theta = -\arctan\left(\frac{A3-A1}{A2-A0}\right). \quad (3)$$

An amplitude A of the reflected optical signal RL may be expressed by Equation 4:

$$A = \frac{\sqrt{(A3-A1)^2 + (A0-A2)^2}}{2}. \quad (4)$$

The amplitude A of the reflected optical signal RL is determined by amplitude of the modulated optical signal EL. An offset B of the reflected optical signal RL may be expressed by Equation 5:

$$B = \frac{A0 + A1 + A2 + A4}{4}. \quad (5)$$

In exemplary embodiments in accordance with principles of inventive concepts, each of the distance pixels 23 includes a photo-receiver, such as a photodiode PD, two transfer transistors TX1 and TX2, two reset transistors RX1 and RX2, two drive transistors DX1 and DX2, and two select transistors SX1 and SX2.

In exemplary embodiments in accordance with principles of inventive concepts, a distance pixel 23 having the 2-tap structure including one photodiode and eight metal oxide semiconductor (MOS) transistors is illustrated in FIG. 2, but the inventive concept is not restricted to the embodiments illustrated in FIG. 2 and may be applied to other configurations, such as 1-tap or 4-tap distance pixels. In other embodiments, at least one of the transistors RX1, RX2, DX1, DX2, SX1, and SX2 may be omitted.

In operation in accordance with principles of inventive concepts of distance pixel 23, the photodiode PD generates photocharge that varies with the intensity of the reflected optical signal RL. The first transfer transistor TX1 may transfer the photocharge to a first floating diffusion node FD1 in response to the first transfer control signal TS1 output from the photo gate controller 28. The second transfer transistor TX2 may transfer the photocharge to a second floating diffusion node FD2 in response to the second transfer control signal TS2 output from the photo gate controller 28. In exemplary embodiments in accordance with principles of inventive concepts, while the first and second transfer control signals TS1 and TS2 are at a high level (of, for example, 3.3 V), the first and second transfer transistors TX1 and TX2 transfer the photocharge generated by a photodetector, such as photodiode PD, to the floating diffusion nodes FD1 and FD2, respectively and while the first and second transfer control signals TS1 and TS2 are at a low level (of, for example, 0 V), the first and second transfer transistors TX1 and TX2 do not transfer the photocharge to the floating diffusion nodes FD1 and FD2.

In exemplary embodiments in accordance with principles of inventive concepts, during a first sampling period Sample1, the first photo gate control signal Ga and the second photo gate control signal Gb may be provided as the first transfer control signal TS1 and the second transfer control signal TS2, respectively. During a second sampling period Sample2, the third photo gate control signal Gc and the fourth photo gate control signal Gd may be provided as the first transfer control signal TS1 and the second transfer control signal TS2, respectively.

In exemplary embodiments in accordance with principles of inventive concepts, each of the first and second sampling periods Sample1 and Sample2 may corresponding to a single period of the clock signal MLS and two sampling periods are employed to generate distance information for a single 2-tap distance pixel 23. When a modulation frequency is 20 MHz, the first and second sampling periods Sample1 and Sample2 each are 50 nsec and the first and second sampling periods Sample1 and Sample2 may come consecutively or intermittently.

In other exemplary embodiments in accordance with principles of inventive concepts, four sampling periods may be used to generate distance information for a single 1-tap distance pixel and one sampling period may be used to generate distance information for a single 4-tap distance pixel.

In exemplary embodiments in accordance with principles of inventive concepts, the first drive transistor DX1 may amplify and transmit the photocharge to the first select transistor SX1 according to the potential of the photocharge accumulated in the floating diffusion node FD1. The second drive transistor DX2 may amplify and transmit the photocharge to the second select transistor SX2 according to the potential of the photocharge accumulated in the floating diffusion node FD2.

In exemplary embodiments in accordance with principles of inventive concepts, the first select transistor SX1 may have a drain terminal connected to a source terminal of the first drive transistor DX1 and may output a pixel signal to a correlated double sampling (CDS)/analog-to-digital conversion (ADC) circuit 36 through a first column line COL1 in response to the selection control signal SEL1 output from the photo gate controller 28. The second select transistor SX2 may have a drain terminal connected to a source terminal of the second drive transistor DX2 and may output a pixel signal to the CDS/ADC circuit 36 through a second column line COL2 in response to the selection control signal SEL2 output from the photo gate controller 28.

The first reset transistor RX1 may reset the floating diffusion node FD1 in response to the reset control signal RS1 output from the photo gate controller 28. The second reset transistor RX2 may reset the floating diffusion node FD2 in response to the reset control signal RS2 output from the photo gate controller 28.

In exemplary embodiments in accordance with principles of inventive concepts, the distance pixel 23 accumulates photocharge for a predetermined period of time, which may be referred to as, for example, an integration time, and outputs pixel signals A0, A1, A2, and A3 generated as a result of the accumulation. A pixel signal $A_k$ generated by the distance pixel 23 is expressed by Equation 6:

$$A_k = \sum_{n=1}^{N} a_{k,n}. \quad (6)$$

In exemplary embodiments in accordance with principles of inventive concepts, when a signal input to the gates (TG1 and TG2 in FIG. 4) of the respective transfer transistors TX1 and TX2 of the distance pixel 23 is the first photo gate control signal Ga, "k" is 0; when it is the third photo gate control signal Gc, "k" is 1; when it is the second photo gate control signal Gb, "k" is 2; and when it is the fourth photo gate control signal Gd, "k" is 3. In Equation 6, $a_{k,n}$ indicates the number of photons (or photocharges) generated in the distance pixel 23 when an n-th ("n" is a natural number) gate signal is applied with a phase difference corresponding to "k" and N=fm*Tint where "fm" denotes the modulation frequency and "Tint" denotes the integration time (for example, a time for which photocharges are accumulated in a floating diffusion node during a single sampling period).

Referring to FIG. 1, under the control of the timing controller 26, the CDS/ADC circuit 36 performs correlated double sampling (CDS) and analog to digital converting (ADC) on the pixel signals A0, A1, A2, and A3 output from the distance pixel 23 and outputs digital pixel signals. The distance sensor 10 illustrated in FIG. 1 may also include active load circuits (not shown) to transmit pixel signals output from a plurality of column lines implemented in the array 22 to the CDS/ADC circuit 36. A memory 38, which s may be implemented as a buffer, receives and stores the digital pixel signals output from the CDS/ADC circuit 36.

The distance sensor 10 may also include an image signal processor (ISP) 39. The ISP 39 may process the pixel signals A0, A1, A2, and A3 output from the memory 38 and compute distance, or depth, information.

Figure 4:
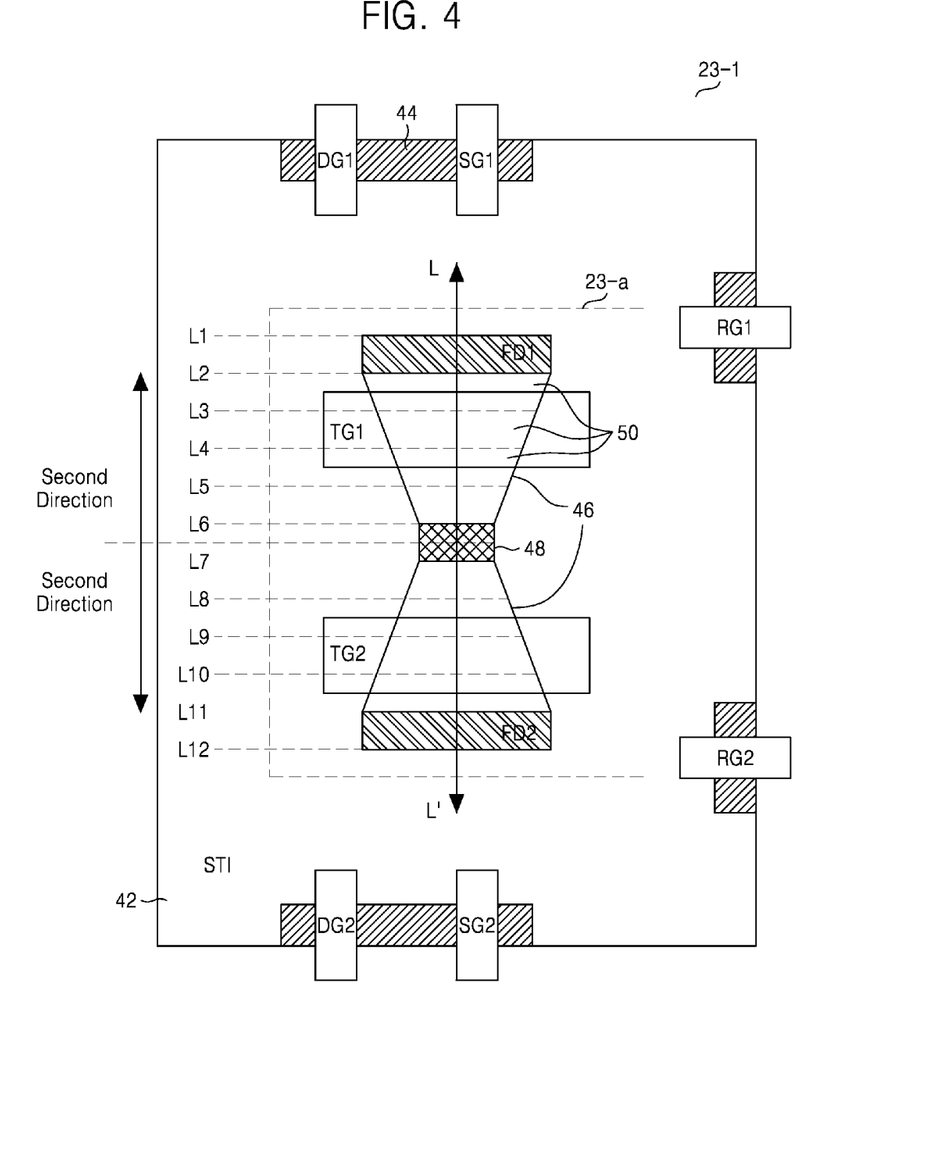
FIG. 4 is a diagram of the layout of the distance pixel illustrated in FIG. 1.
Figure 5:
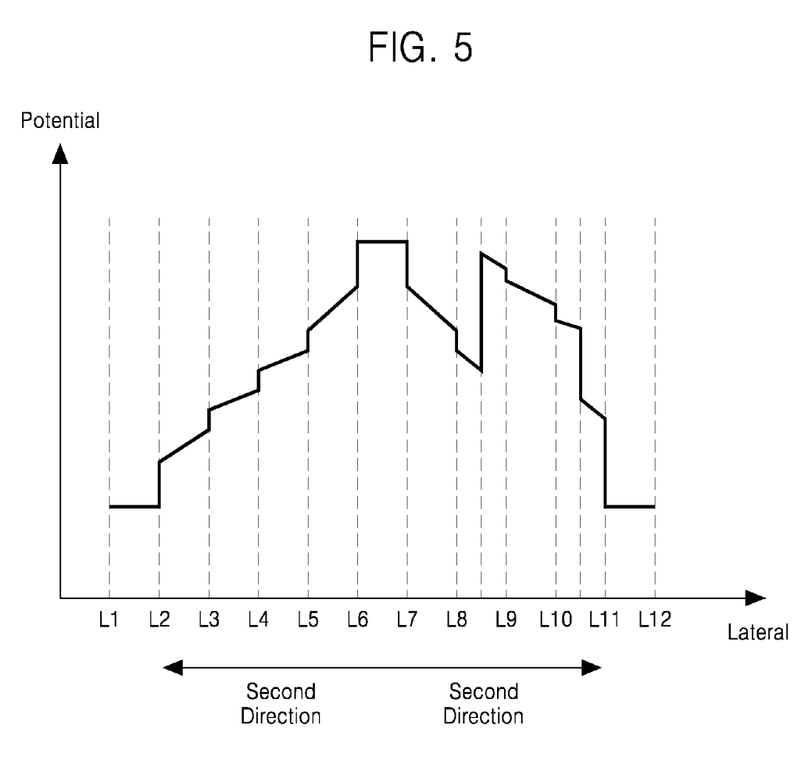
FIG. 5 is a diagram showing the change in potential of a part of the layout illustrated in FIG. 4.

FIG. 4 is a diagram of an exemplary embodiment of a layout 23-1 of each of the distance pixels 23 illustrated in FIG. 1. FIG. 5 is a diagram showing the change in the potential of a part of the layout 23-1 illustrated in FIG. 4. Referring to FIGS. 1 through 5, the distance pixel layout 23-1 includes a shallow trench isolation (STI) region 42, a well region 44, the floating diffusion nodes FD1 and FD2, the gates TG1 and TG2 of the respective transfer transistors TX1 and TX2, gates DG1 and DG2 of the respective drive transistors DX1 and DX2, gates SG1 and SG2 of the respective select transistors SX1 and SX2, gates RG1 and RG2 of the respective reset transistors RX1 and RX2, a photodiode 46, and a pinning layer 48. Although FIG. 4 shows the layout of a 2-tap distance pixel, inventive concepts are not limited thereto and may be applied to pixels having other structures such as 1-tap pixels and 4-tap pixels, for example. Additionally, the arrangement of elements is not restricted to the exemplary embodiment of a distance pixel layout 23-1 in accordance with principles of inventive concepts illustrated in FIG. 4.

In exemplary embodiments in accordance with principles of inventive concepts, the STI region 42 may be formed to electrically or optically isolate adjacent elements from each other. The STI region 42 formed using an STI process may be filled with oxide and poly silicon, for example. The STI region 42 may reduce or prevent electric crosstalk that could otherwise diminish signal-to-noise ratio (SNR) due to the exchange of carriers between adjacent elements. The sidewall of the STI region 42 may be doped with a material having a high reflectance, thereby reducing or preventing optical crosstalk that could otherwise diminish SNR due to the permeation to a second distance pixel 23 of light that is incident on a first distance pixel 23. In exemplary embodiments in accordance with principles of inventive concepts, the sidewall of the STI region 42 may be formed of poly silicon doped with boron having a high reflectance, for example.

The well region 44 may be formed around the gates RG1, RG2, DG1, DG2, SG1, and SG2. The well region 44 may include a high-density doped region (not shown). The high-density doped region may function as a source or drain terminal of the transistors RX1, RX2, DX1, DX2, SX1, and SX2. The well region 44 may electrically insulate the high-density doped region.

The floating diffusion nodes FD1 and FD2, the gates TG1 and TG2 of the respective transfer transistors TX1 and TX2, the gates DG1 and DG2 of the respective drive transistors DX1 and DX2, the gates SG1 and SG2 of the respective select transistors SX1 and SX2, and gates RG1 and RG2 of the respective reset transistors RX1 and RX2 may accumulate photocharges or receive one of the control signals TS1, TS2, SEL1, SEL2, RS1, RS2, as described above in the discussion related to FIG. 2.

In exemplary embodiments in accordance with principles of inventive concepts, the photodiode 46 may be formed using ion implantation. The photodiode 46 may be formed of an n-type region when the transfer transistors TX1 and TX2 are p-type MOS (PMOS) transistors. The photodiode 46 may be formed of a p-type region when the transfer transistors TX1 and TX2 are n-type MOS (NMOS) transistors.

The pinning layer 48 may be formed to have a high potential to electrically insulate the gates TG1 and TG2 from each other.

The photodiode 46 may include a plurality of doped regions in a stack structure, for example. The photodiode 46 may include a plurality of second layers 50 in a second direction. The second layers 50 may be defined by a border at which a cross-sectional area or a pinning voltage changes for clarity of the description. The cross-sectional area or the pinning voltage of the photodiode 46 may continuously vary.

The second layers 50 may have a cross-sectional area continuously increasing along a second direction. As the cross-sectional area of the second layers 50 increases along the second direction, the potential of the second layers 50 decreases, so that a strong electric field is formed in the second direction.

In other exemplary embodiments in accordance with principles of inventive concepts, the second layers 50 may have a fixed cross-sectional area intermittently increasing at borders L3, L4, L5 L8, L9, and L10. In addition, the second layers 50 may have a pinning voltage increasing along the second direction. That is, in exemplary embodiments in accordance with principles of inventive concepts, the second layers 50 may have a doping density or a junction distance increasing along the second direction. As a result, the potential intermittently decreases at the borders L3, L4, L5 L8, L9, and L10 and a strong electric field is formed in the second direction.

In still other exemplary embodiments in accordance with principles of inventive concepts, the photodiode 46 may be formed to have a doping density or junction depth continuously increasing along the second direction.

FIG. 5 illustrates the potential distribution in a lateral direction L-L' of a part 23-a of the distance pixel layout 23-1 when the first transfer control signal TS1 at the high level (for example, 3.3 V) is applied to the gate TG1 of the first transfer transistor TX1 and the second transfer control signal TS2 at the low level (for example, 0 V) is applied to the gate TG2 of the second transfer transistor TX2. The potential is highest between the borders L6 and L7 in which the pinning layer 48 is positioned, and intermittently decreases at the borders L6 and L7 between the pinning layer 48 and the photodiode 46, at the borders L3, L4, L5, L8, L9, and L10 of the second layers 50, and at the borders L2 and L11 between the photodiode 46 and the first floating diffusion node FD1. Because the cross-sectional area of the second layers 50 continuously increases along the second direction, the potential of the second layers 50 continuously decreases. The slope of the potential of the second layers 50 is determined by the rate at which the cross-sectional area of the second layers 50 increases. Accordingly, a strong electric field is formed in the second direction, increasing the speed of photocharges.

However, the potential becomes high again from between the borders L8 and L9 to between the borders L10 and L11, where the gate TG2 of the second transfer transistor TX2 to which the second transfer control signal TS2 at the low level (for example, 0 V) is applied is positioned. As a result, the photocharges are inhibited from movement in the second direction.

In exemplary embodiments in accordance with principles of inventive concepts, the sampling periods Sample1 and Sample2 illustrated in FIG. 3 are very brief, and therefore, the photocharges generated in the photodiode 46 need to move to the floating diffusion nodes FD1 and FD2 as quickly as possible. According to exemplary embodiments in accordance with principles of inventive concepts, a strong electric field is formed in the second direction, that is, a direction in which the photocharges move horizontally, thereby accelerating the speed of the photocharges. As a result, the demodulation contrast of the distance pixel 23 increases and, a pixel signal having high sensitivity can be obtained while a fill factor, the ratio of a light receiving area to the area of a distance pixel, and resolution are maintained.

Although eight second layers 50 are illustrated in the embodiments illustrated in FIG. 4, inventive concepts are not restricted thereto.

Figure 6:
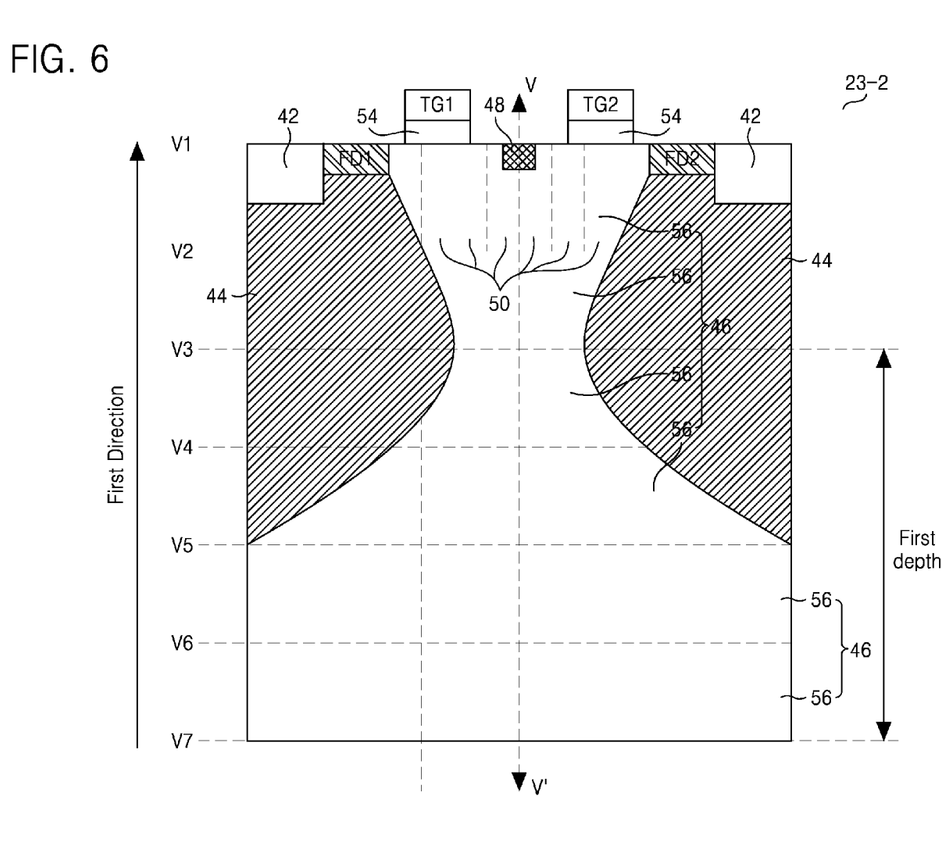
FIG. 6 is a diagram of the cross-section of a part of the layout illustrated in FIG. 4.
Figure 7:
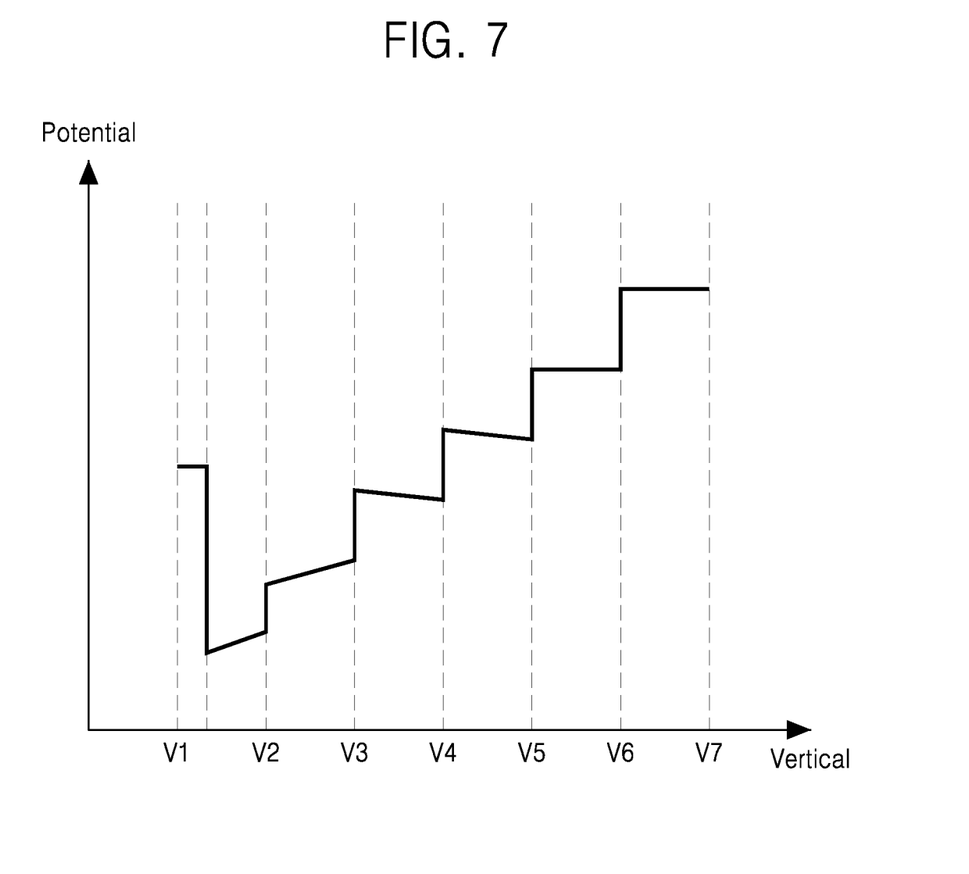
FIG. 7 is a diagram showing the change in potential of the cross-section illustrated in FIG. 6.

FIG. 6 is a diagram of a cross-section 23-2 of a part of an exemplary embodiment of a distance pixel layout 23-1 such as that illustrated in FIG. 4. FIG. 7 is a diagram showing the change in potential of the cross-section 23-2 illustrated in FIG. 6. Referring to FIGS. 1 through 7, the cross-section 23-2 taken along the lateral direction L-L' in FIG. 5 includes the STI region 42, the floating diffusion nodes FD1 and FD2, the gates TG1 and TG2 of the respective transfer transistors TX1 and TX2, the photodiode 46, the pinning layer 48, and a gate insulation layer 54.

Multiple layers of conductive lines (not shown) may be included in the top of the cross-section 23-2 and the conductive lines may be formed, for example, by patterning a conductive material containing a metal material such as copper or aluminum.

The photodiode 46 may include a plurality of first layers 56 formed along a first direction, which may be a direction in which the reflected optical signal RL is incident on the distance pixel 23.

For brevity and clarity of description, the first layers 56 may be defined by a border at which a cross-sectional area or a pinning voltage changes, for example. In accordance with principles of inventive concepts, the cross-sectional area or the pinning voltage of the photodiode 46 may continuously change.

The first layers 56 may have a cross-sectional area continuously increasing along the first direction after a first depth. The first depth may be randomly determined along the vertical cross section of the photodiode 46. In accordance with principles of inventive concepts, as the cross-sectional area of the first layers 56 increases along the first direction, the potential of the first layers 56 decreases, so that a strong electric field is formed in the first direction. The cross-sectional area of the first layers 56 may decrease (in a section between borders V3 and V5) or remain constant (in a section between borders V5 and V7) up to the first depth along the first direction in order to increase the fill factor and the resolution.

In other exemplary embodiments in accordance with principles of inventive concepts, the first layers 56 may have a fixed cross-sectional area after the first depth and intermittently increasing depth at a border V2. In addition, the first layers 56 may be formed to have a pinning voltage increasing along the first direction. That is, in accordance with principles of inventive concepts, the first layers 56 may have a doping density increasing along the first direction and, as a result, the potential intermittently decreases at borders V2, V3, V4, V5, and V6 of the first layers 56 and a strong electric field is formed in the first direction. A first layer 56 (between the borders V1 and V2) at the top may include a plurality of the second layers 50 illustrated in FIG. 4. The potential of the second layers 50 may be lower than that of a first layer 56 between the borders V2 and V3.

In other exemplary embodiments in accordance with principles of inventive concepts, the photodiode 46 may have a doping density continuously increasing along the first direction.

Referring to FIG. 7, the potential in a vertical direction V-V' of the part 23-*a* of the distance pixel layout 23-1 is highest between borders V6 and V7 on which the reflected optical signal RL is first incident and intermittently decreases at the borders V6, V5, V4, V3, and V2 of the first layers 56. Because the cross-sectional area of the first layers 56 continuously increases along the first direction after the first depth, the potential of the first layers 56 continuously decreases. The slope of the potential of the first layers 56 is determined by a rate at which the cross-sectional area of the first layers 56 increases. Accordingly, in accordance with principles of inventive concepts, a strong electric field is formed in the first direction, increasing the speed of photocharges.

The sampling periods Sample1 and Sample2 illustrated in FIG. 3 are very brief, and therefore, the photocharges generated in the photodiode 46 need to move to the floating diffusion nodes FD1 and FD2 as quickly as possible. According to this exemplary embodiment in accordance with principles of inventive concepts, a strong electric field is formed in the first direction, that is, a direction in which the photocharges move vertically, thereby accelerating the photocharges. Therefore, in accordance with principles of inventive concepts, the demodulation contrast of the distance pixel 23 increases and a pixel signal having high sensitivity can be obtained while, at the same time, the fill factor and the resolution are maintained constant.

Although six first layers 56 are illustrated in the exemplary embodiments illustrated in FIG. 6, inventive concepts are not limited thereto.

The gate insulation layer 54 may be formed below each of the gates TG1 and TG2 of the respective transfer transistors TX1 and TX2. The gate insulation layer 54 may be formed of $SiO_2$, SiON, SiN, $Al_2O_3$, $Si_4N_4$, $Ge_xO_yN_z$, $Ge_xSi_yO_z$, or a high dielectric material, for example. The high dielectric material may be $HfO_2$, $ZrO_2$, $Al_2O_3$, $Ta_2O_5$, hafnium silicate, zirconium silicate, or a combination thereof which is formed using atomic layer deposition, for example.

Figure 8:
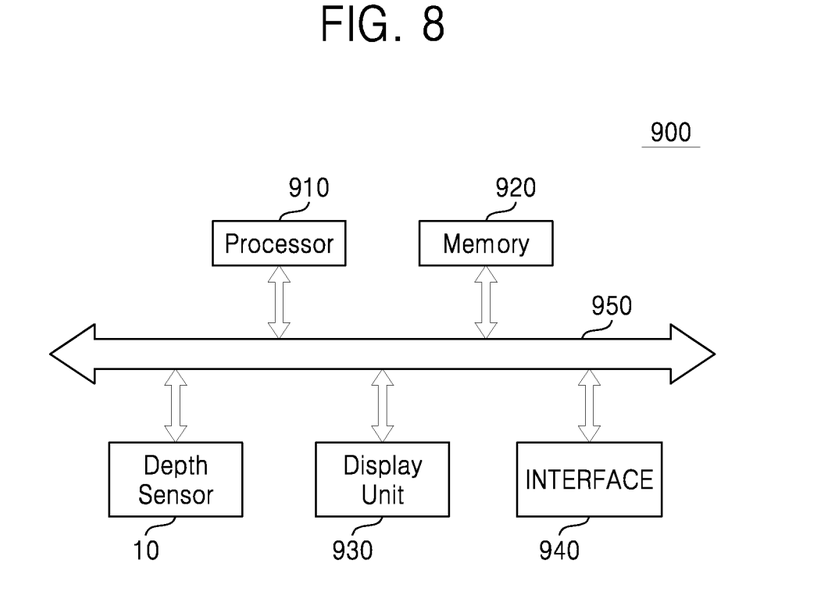
FIG. 8 is a block diagram of an image processing system including the distance sensor illustrated in FIG. 1 according to exemplary embodiments in accordance with principles of inventive concepts.

FIG. 8 is a block diagram of an exemplary embodiment of an image processing system 900 including the distance sensor 10 illustrated in FIG. 1 according to principles of inventive concepts. Referring to FIGS. 1 and 8, the image processing system 900 may include the distance sensor 10, a processor 910, a memory 920, a display unit 930, and an interface 940.

The processor 910 may control the operation of the distance sensor 10 or process image data output from the distance sensor 10. For example, the processor 910 may generate two-dimensional (2D) distance image data based on distance information of the scene 40 output from the distance sensor 10. The processor 910 may be the ISP 39, for example.

The memory 920 may store a program for controlling the operation of the distance sensor 10 through a bus 950 according to the control of the processor 910 and may store an image generated by the processor 910. The processor 910 may access the memory 920 and execute the program. The memory 920 may be implemented by non-volatile memory.

The display unit 930 may receive an image from the processor 910 or the memory 920 and display the image through a display such as a liquid crystal display (LCD), a light emitting diode (LED) display, organic LED (OLED) display, an active matrix OLED (AMOLED) display, or a flexible display. The interface 940 may be implemented to input and output 2D or 3D images. The interface 940 may be a wireless interface, for example.

Figure 9:
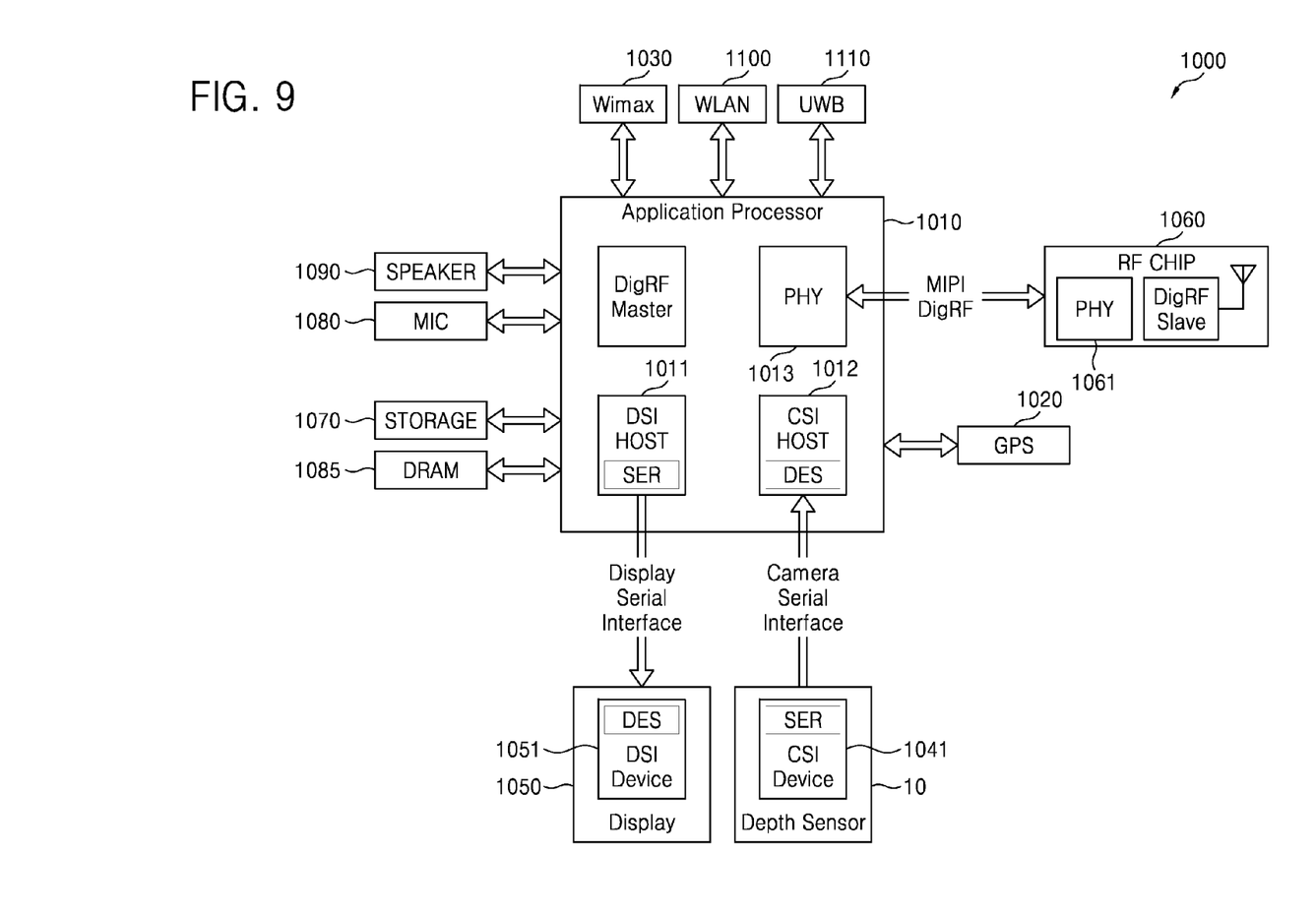
FIG. 9 is a block diagram of an electronic system including the distance sensor illustrated in FIG. 1 according to exemplary embodiments in accordance with principles of inventive concepts.

FIG. 9 is a block diagram of an exemplary embodiment of an electronic system 1000 in accordance with principles of inventive concepts including a distance sensor 10 in accordance with principles of inventive concepts, such as that illustrated in FIG. 1. Referring to FIGS. 1 and 9, the electronic system 1000 may be implemented as a data processing device, such as a personal digital assistant (PDA), a portable media player (PMP), an Internet protocol television (IPTV), a cellular telephone, a portable notebook or tablet computer, or a smart phone, which can use or support mobile industry processor interface (MIPI). The electronic system 1000 includes the distance sensor 10, an application processor 1010, and a display 1050.

A camera serial interface (CSI) host 1012 implemented in the application processor 1010 may perform serial communication with a CSI device 1041 included in the distance sensor 10 through a CSI. In accordance with principles of inventive concepts, a deserializer DES and a serializer SER may be implemented in the CSI host 1012 and the CSI device 1041, respectively.

A display serial interface (DSI) host 1011 implemented in the application processor 1010 may perform serial communication with a DSI device 1051 included in the display 1050 through DSI. In accordance with principles of inventive concepts, a serializer SER and a deserializer DES may be implemented in the DSI host 1011 and the DSI device 1051, respectively.

The electronic system 1000 may also include a radio frequency (RF) chip 1060 communicating with the application processor 1010. A physical layer (PHY) 1013 of the application processor 1010 and a PHY 1061 of the RF chip 1060 may communicate data with each other according to MIPI DigRF.

The electronic system 1000 may further include a global positioning system (GPS) 1020, a storage 1070, a microphone (MIC) 1080, a dynamic random access memory (DRAM) 1085, and a speaker 1090. The electronic system 1000 may communicate using a worldwide interoperability for microwave access (Wimax) 1030, a wireless local area network (WLAN) 1100, and/or an ultra-wideband (UWB) 1110.

As described above, in exemplary embodiments in accordance with principles of inventive concepts, a strong electric field is formed in a direction in which photocharges move horizontally or vertically in a pixel of a distance sensor, thereby increasing the speed of the photocharges and, as a result, sensitivity and demodulation contrast are increased.

While inventive concepts have been shown and described with reference to exemplary embodiments thereof, it will be understood by those of ordinary skill in the art that various changes in forms and details may be made therein without departing from the spirit and scope of inventive concepts as defined by the following claims.

What is claimed is:

1. A pixel of a distance sensor, the pixel comprising:
a photosensor arranged to generate photocharges corresponding to light incident in a first direction and to have a cross-sectional area increasing along the first direction after a first depth and the cross-sectional area decreasing along the first direction up to the first depth to accelerate the photocharges; and
at least one transfer gate arranged to receive a transfer control signal for transferring the photocharges to a floating diffusion node at a rate accommodated by the accelerated photocharges to thereby determine a distance by time-of-flight.

2. The pixel of claim 1, wherein the photosensor comprises a plurality of first layers having a pinning voltage that increases along the first direction.

3. The pixel of claim 2, wherein a doping density is arranged to determine the pinning voltage of the first layers.

4. The pixel of claim 1, wherein the cross-sectional area of the photosensor decreases along the first direction up to the first depth.

5. The pixel of claim 1, wherein the photosensor comprises a plurality of second layers having a cross-sectional area that increases along a second direction and the second direction gets towards the floating diffusion node in perpendicular to the first direction.

6. The pixel of claim 5, wherein the second layers have a pinning voltage that increases along the second direction.

7. The pixel of claim 6, wherein the pinning voltage of the second layers is determined by one of a doping density and a junction depth.

8. The pixel of claim 1, wherein the at least one transfer gate comprises two transfer gates in a 2-tap structure.

9. The pixel of claim 8, further comprising a pinning layer between the two transfer gates.

10. The pixel of claim 9, wherein the two transfer gates respectively receive transfer control signals respectively having opposite phases.

11. The pixel of claim 1, further comprising at least one select gate arranged to receive a selection control signal for outputting an electrical signal corresponding to photocharges accumulated in the floating diffusion node.

* * * * *